United States Patent
Yang et al.

(10) Patent No.: US 6,872,428 B2
(45) Date of Patent: Mar. 29, 2005

(54) APPARATUS AND METHOD FOR LARGE AREA CHEMICAL VAPOR DEPOSITION USING MULTIPLE EXPANDING THERMAL PLASMA GENERATORS

(75) Inventors: Barry Lee-Mean Yang, Clifton Park, NY (US); Charles Dominic Iacovangelo, Niskayuna, NY (US); Kenneth Walter Browall, Schenectady, NY (US); Steven Marc Gasworth, Farmington Hills, MI (US); William Arthur Morrison, Albany, NY (US); James Neil Johnson, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 6 days.

(21) Appl. No.: 10/063,094

(22) Filed: Mar. 19, 2002

(65) Prior Publication Data

US 2003/0072881 A1 Apr. 17, 2003

Related U.S. Application Data

(62) Division of application No. 09/681,820, filed on Jun. 11, 2001, now Pat. No. 6,397,776.

(51) Int. Cl.$^7$ .............................................. C23C 16/00
(52) U.S. Cl. ...................... 427/568; 427/579; 427/580; 427/255.37; 427/255.5
(58) Field of Search ................................. 427/580, 579, 427/568, 255.37, 255.5

(56) References Cited

U.S. PATENT DOCUMENTS

| 4,948,485 A | | 8/1990 | Wallstén et al. |
| 5,062,508 A | * | 11/1991 | Ackermann et al. . 118/723 ME |
| 5,302,271 A | | 4/1994 | Chan et al. |
| 5,441,624 A | * | 8/1995 | Chan et al. ............ 204/298.41 |
| 5,985,378 A | * | 11/1999 | Paquet ........................ 427/562 |
| 6,110,544 A | * | 8/2000 | Yang et al. ................. 427/580 |

FOREIGN PATENT DOCUMENTS

EP         887110 A1 * 12/1998 ............. B05B/7/22

* cited by examiner

Primary Examiner—Timothy Meeks
(74) Attorney, Agent, or Firm—Tanzina S. Chowdhury; Patrick K. Patnode

(57) ABSTRACT

Chemical vapor deposition is performed using a plurality of expanding thermal plasma generating means to produce a coating on a substrate, such as a thermoplastic and especially a polycarbonate substrate. The substrate is preferably moved past the generating means. Included are methods which coat both sides of the substrate or which employ multiple sets of generating means, either in a single deposition chamber or in a plurality of chambers for deposition of successive coatings. The substrate surfaces spaced from the axes of the generating means are preferably heated to promote coating uniformity.

14 Claims, 10 Drawing Sheets

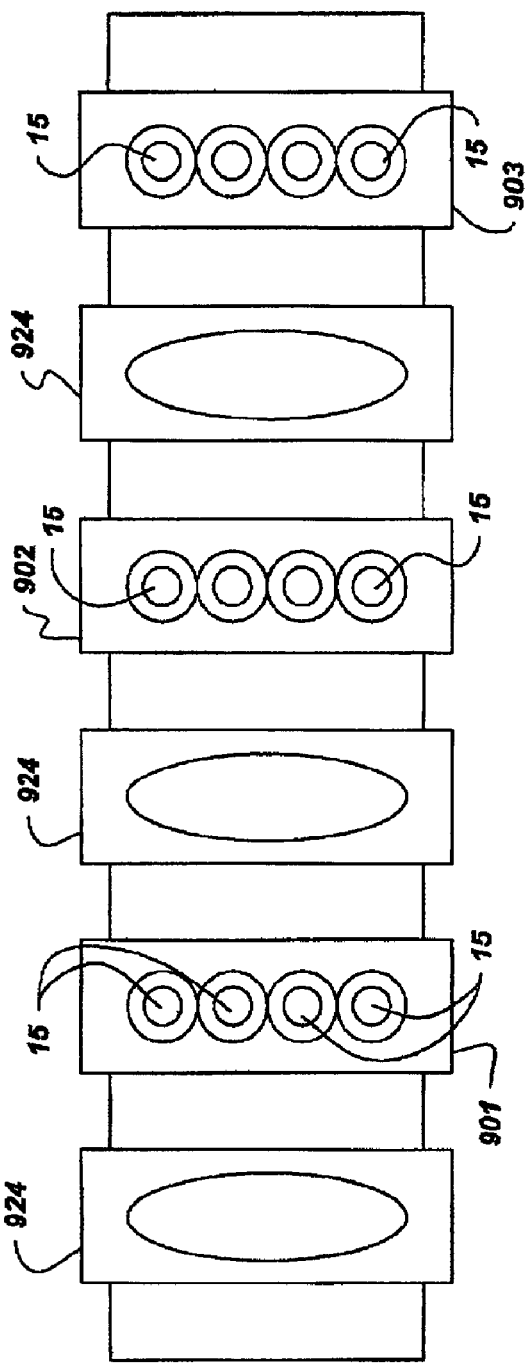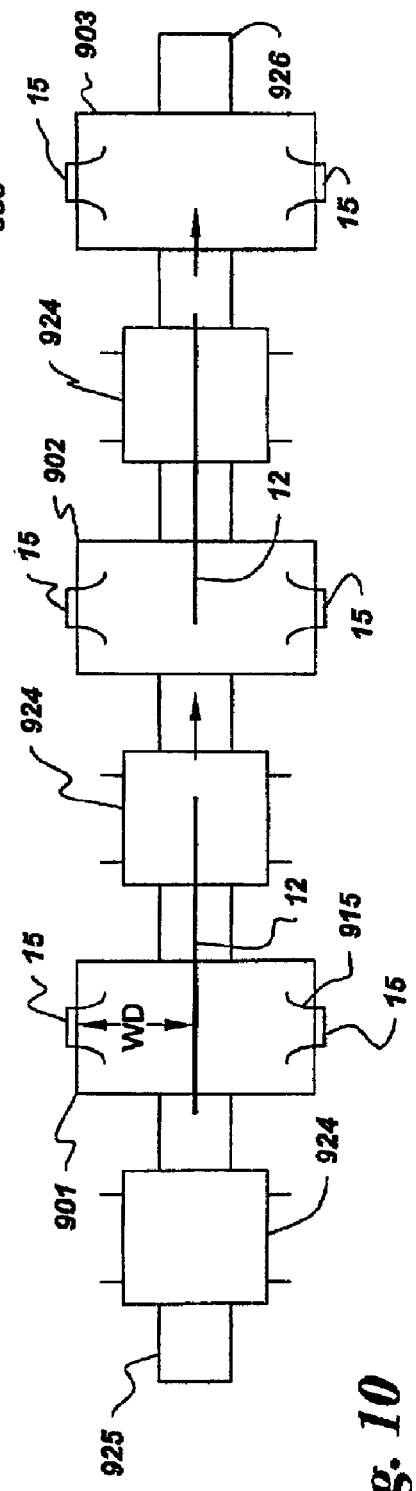
Fig. 9
Fig. 10

APPARATUS AND METHOD FOR LARGE AREA CHEMICAL VAPOR DEPOSITION USING MULTIPLE EXPANDING THERMAL PLASMA GENERATORS

This application is a divisional of Ser. No. 09/681,820, filed Jun. 11, 2001, now U.S. Pat. No. 6,397,776.

BACKGROUND OF INVENTION

This invention relates to plasma enhanced chemical vapor deposition. More particularly, it relates to deposition in an expanding thermal plasma (hereinafter referred to as "ETP") system to coat large areas of a substrate.

The use of ETP to deposit coatings, especially protective coatings, on substrates is known. For example, U.S. Pat. No. 6,110,544 describes a method of forming coatings on a plastic substrate such as polycarbonate. The coatings that may be deposited include silicon oxide-based hardcoats, which can protect the plastic surface from abrasion. Also capable of deposition are metal oxide-based coatings such as zinc oxide. Coatings of these types are produced by introducing an organosilicon or organometallic compound into an ETP and causing the plasma stream produced by said ETP to impinge upon the surface of the substrate. By using ETP, particularly those using equilibrium thermal plasma arc generators, high coating deposition rates may be achieved at relatively low temperatures. It is particularly desirable that the substrate temperature be maintained lower than its glass transition temperature and/or softening temperature.

A problem with ETP deposition as described in the prior art is its incapability of efficiently producing a coating over a large area of a substrate. A single ETP source typically coats an area of about 75–200 cm$^2$. Thus, many passes of a substrate into contact with the ETP would be necessary to coat the entire surface thereof.

Various publications disclose coating apparatus and systems using a plurality of coating units. For example, U.S. Pat. No. 4,948,485 discloses the disposition of a number of cascade arc plasma torches in a circular array around an axis, which may, for example, be a wire to be coated. Such a system is incapable being used to coat a single surface of, for example, a planar substrate.

U.S. Pat. Nos. 5,302,271 and 5,441,624 disclose multi-anodic arc coating systems in which the arcs are directed at a single surface of a substrate. Anodic arcs are fundamentally different from ETP sources in that they do not generate a thermal plasma and they use a consumable anode as the source material for deposition. In addition, those arcs are used for physical vapor deposition. As such, their operating parameters, such as arc-to-arc spacing, arc to substrate distance, and deposition pressure, are not adapted to ETP deposition.

It is of interest, therefore, to develop an apparatus and method suitable for coating relatively large areas of a substrate by ETP deposition. In particular, an apparatus and method that is adaptable to various configurations of substrates and to the particular parameters of ETP systems is desirable.

SUMMARY OF INVENTION

The present invention provides an ETP coating apparatus and process particularly adapted to efficiently coat large substrates. The invention can be configured so as to provide coatings having desirable properties, including uniformity and reproducibility.

One aspect of the invention is to provide a substrate coating apparatus. The apparatus comprises: a deposition chamber adapted to be maintained at subatmospheric pressure; support means in the deposition chamber for a substrate, the substrate having at least one surface; and a set of expanding thermal plasma generating means associated with the deposition chamber, the generating means being adapted to deposit a coating on the substrate. The set comprises at least two expanding plasma generating means, with all of the means in the set being codirectionally oriented.

Another aspect of the invention is to provide a method for coating a substrate. The method comprises generating a set of at least two expanding thermal plasma plumes to deposit a coating on said substrate, wherein each of the plumes in the set is codirectionally oriented.

BRIEF DESCRIPTION OF DRAWINGS

FIGS. 9 and 10 are orthogonal views of an embodiment including several coating units according to the invention;

DETAILED DESCRIPTION

Figure 1:
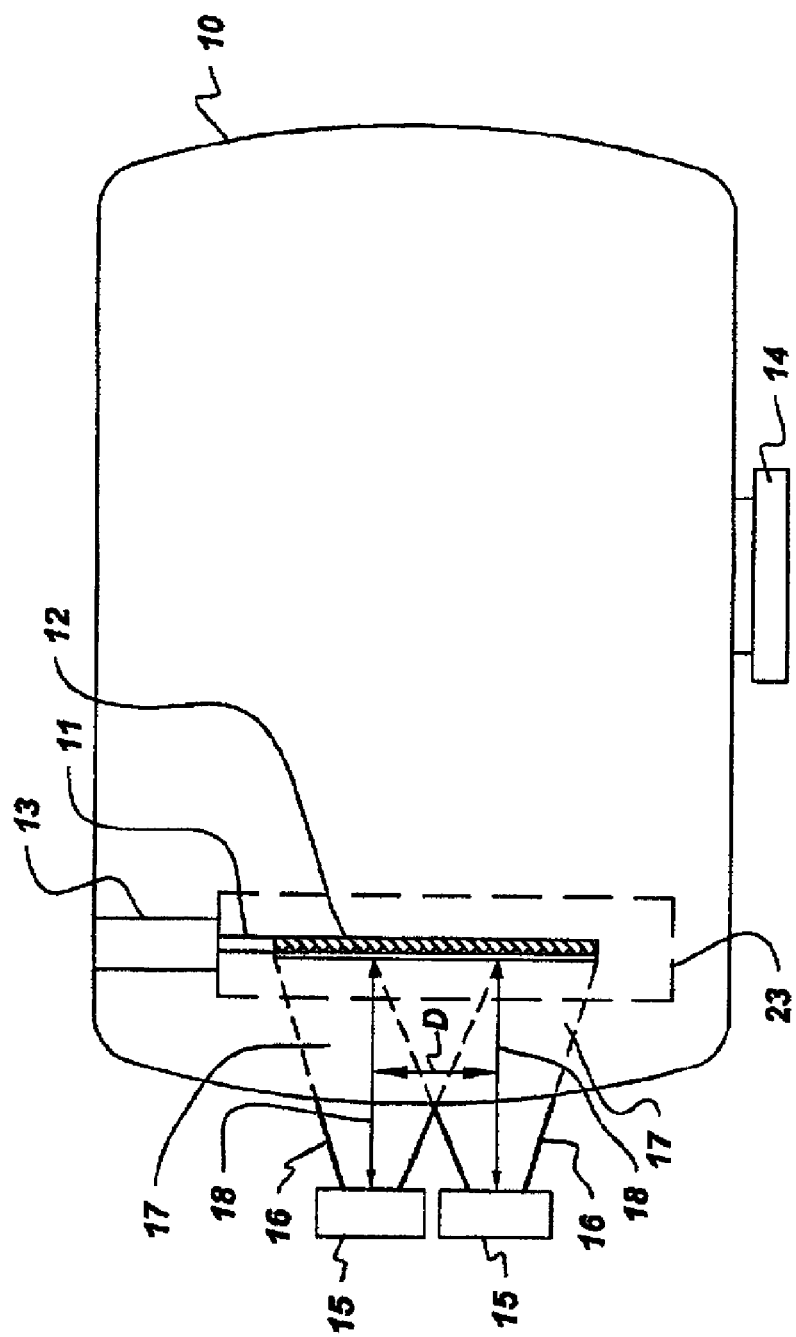
FIG. 1 is a schematic view of an illustrative substrate coating apparatus of the invention, in which ETP generating means are located outside the deposition chamber.

An embodiment of the substrate coating apparatus of the present invention is shown in FIG. 1. It includes deposition chamber 10 equipped with vacuum-producing means 14, such as a vacuum pump. Substrate support means 11, which may be a hook, frame, arm, clamp, or the like, holds substrate 12. As shown in FIG. 1, support means 11 is attached to movement actuator 13, described hereinafter, so that substrate 12 can be moved perpendicular to the plane of the figure; i.e., in and/or out of said plane. However, it is also within the scope of the invention for support means 11 to be fixed in position within deposition chamber 10.

Substrate 12 is shown as a planar (i.e., flat) object in FIG. 1, but it is also contemplated for substrate 12 to be curved or of irregular shape, as described hereinafter. In general, however, substrate 12 will have a substantial width dimension, typically at least about 25 cm and preferably at least about 50 cm. That is, it is preferably not a wire, which is essentially a one-dimensional object. For the most part, the length dimension of the substrate will also be at least about 25 and most often at least about 100 cm.

The substrate may be of any suitable material including metal, semiconductor, ceramic, glass or plastic. In a preferred embodiment, it is a thermoplastic such as polycarbonate, copolyestercarbonate, polyethersulfone, polyetherimide or acrylic. Polycarbonate is particularly preferred; the term "polycarbonate" in this context including homopolycarbonates, copolycarbonates and copolyestercarbonates.

Associated with (i.e., in FIG. 1, outside but in effective communication with) deposition chamber 10 are ETP generating means 15. According to the invention, a plurality of said means are present; two are shown in the figure, but there may and frequently will be more than two, for example up to about 12. ETP generating means 15 may also be wholly within said deposition chamber. Typically, each of said ETP generating means has provision for independent adjustment of spacing, distance to substrate, and reagent feed.

Each ETP generating means shown in FIG. 1 is fitted with plasma nozzle 16 (although a nozzle is not a required aspect of the invention), whereby plumes 17 of plasma are produced which contact one side of substrate 12. Each plume 17 has a central axis 18 and said central axes are spaced from each other at a distance D. As shown, plumes 17 intersect each other and there is an area of the substrate contacted by both plumes, and this will generally be the case as described in detail hereinafter.

All of the ETP generating means in a set are codirectionally oriented, i.e., they point in the same direction so as to produce plasma plumes in the same direction. It is, however, within the scope of the invention to employ more than one set of ETP generating means. For example, two sets oriented in opposite directions can be employed on either side of a substrate in the form of a sheet, whereby coatings on both sides of said sheet are produced.

The ETP generating means in any set thereof are oriented so that the plasmas produced thereby will impinge on the substrate and produce a coating thereon. Thus, they generally point toward a side of the substrate; for example, such that the central axes of the plasmas are perpendicular to the substrate when the substrate is flat and in an analogous configuration for curved and/or irregular shaped substrates. Beyond that, certain highly preferred orientation parameters have been discovered and are described in detail hereinafter. Preferably, however, the substrate support means is attached to movement actuator 13, such as a pull cord or ribbon, a rail, a screw rod, or one or more wheels or bearings, any of which may be powered by a motor (not shown), whereby the substrate may be moved past the set of ETP generating means for efficiency of coating. As shown in FIG. 1, substrate 12 will move in a plane perpendicular to that of the figure. It may move into and out of deposition chamber 10 through appropriate openings 23 in the walls of said chamber.

Figure 2:
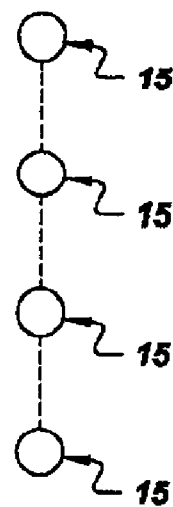
FIGS. 2 and 3 are illustrative configurations of ETP generating means according to the invention.
Figure 3:
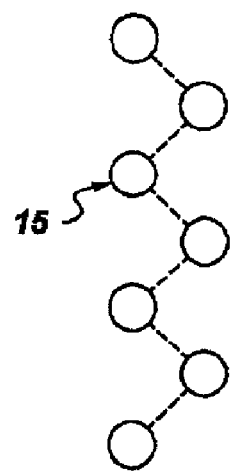

Particularly when a movement actuator is present, the ETP generating means in a set may be in a straight line parallel to the plane of motion of the substrate, as shown in FIG. 2, in which four such means are in a straight line represented by the dashed line in said figure, and with the center axes of the plasma plumes produced by said ETP generating means oriented perpendicular to the plane of motion of the substrate support means. They may also be in a zigzag configuration in a plane parallel to said plane of motion, as shown in FIG. 3, in which seven such means are so arranged. The angle between successive lines leading from one ETP generating means 15 to the next is typically in the range of about 10–80°, and preferably about 30–60°.

In each of FIGS. 2 and 3, the plane of motion of the substrate is spaced from that of the figure and its direction of motion is from left to right. Other configurations are also contemplated. For example, a dome-shaped substrate may be coated with a set of ETP generating means in a circular array, but in that instance it may be preferable not to move the substrate during the coating operation.

Figure 4:
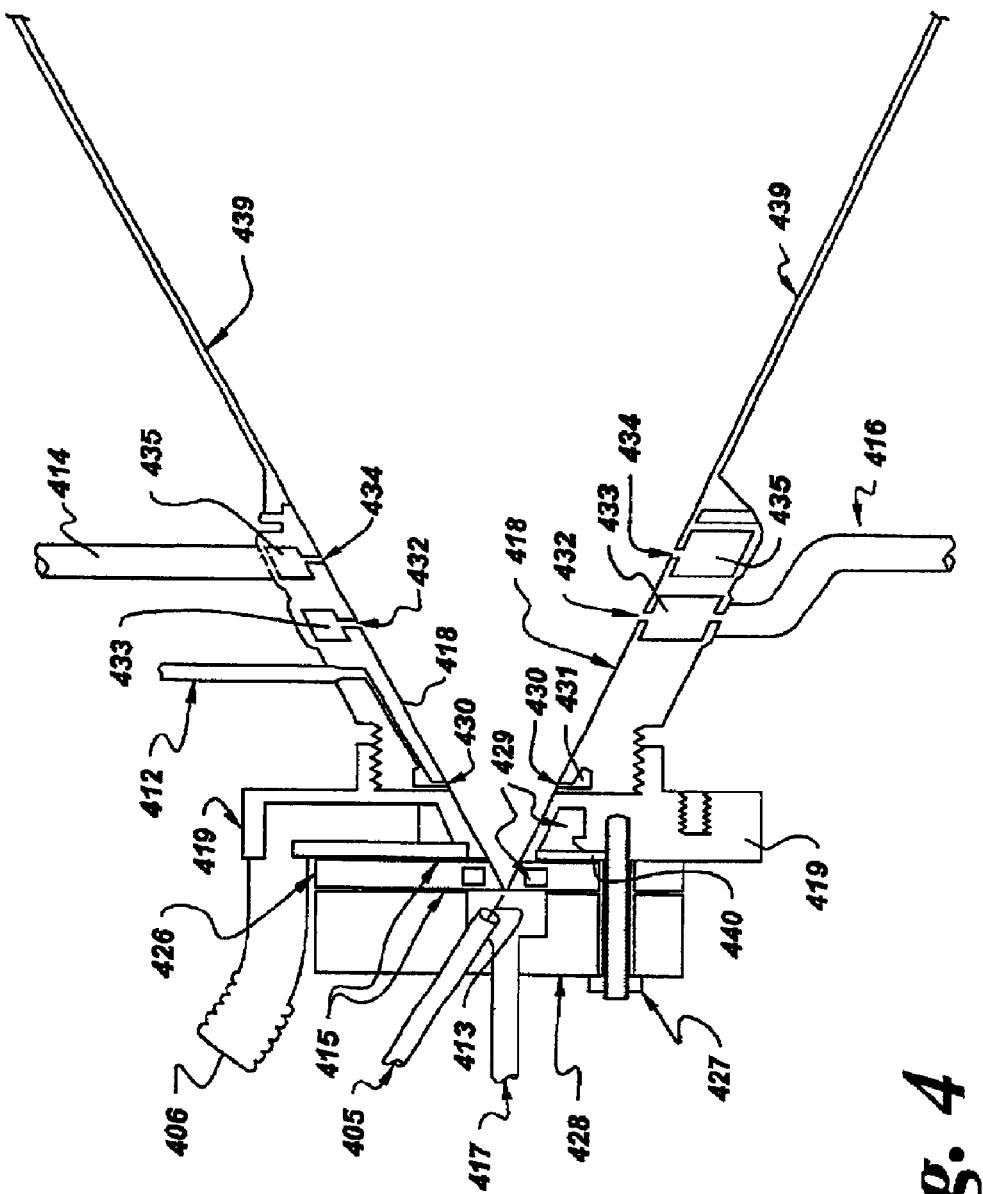
FIG. 4 is a schematic cross-sectional view of an ETP generating means useful in the invention.

FIG. 4 shows one suitable design for ETP generating means 15, said means being classified as a wall-stabilized DC arc generator. It should be understood, however, that other designs are possible and that the embodiment of FIG. 4 is only illustrative.

Said embodiment includes at least one cathode 413, plasma gas supply line 417, and anode 419. Typically, more than one cathode 413 is present. Cathode(s) 413 may comprise tungsten or thorium-doped tungsten tips and may be surrounded by cathode housing 405 to isolate cathode 413 from the walls of cathode support plate 428 and to provide for water cooling. Cathode housing 405 may comprise a shell surrounding an isolating mantle made from an insulating material such as polyvinyl chloride or polytetrafluoroethylene.

Cathodes 413 are separated from anode 419 by at least one cascade plate 426, preferably comprising copper discs containing a central aperture having a shape corresponding to that of the anode aperture.

Optionally, cathode(s) 413 may also contain a purging gas supply line adjacent to plasma gas supply line 417 to supply a purging or flushing gas, such as argon, prior to supplying a plasma gas.

Referring again to FIG. 4, ETP generating means 15 also contains at least one plasma gas supply line 417. To form a plasma, at least one plasma gas is supplied through said plasma gas supply. The plasma gas may comprise a noble gas, nitrogen, ammonia, or hydrogen, for example, or any combination thereof, with argon often being preferred. If there is more than one plasma gas, then the plural gases may either be supplied through plural supply lines or may be premixed before being supplied to line 417. Referring again to FIG. 1, the plasma gas in ETP generating means 15 is maintained at a higher pressure than the pressure in deposition chamber 10, which is continuously evacuated by a pump. A DC voltage is then applied between cathode(s) 413 and the anode 419 to generate a plasma in ETP generating means 15. The plasma is then emitted as a supersonic plasma via the anode 419 aperture and expanded as a plasma plume into deposition chamber 10 due to the pressure difference between deposition chamber 10 and ETP generating means 15.

The cathode support plate 428 is attached to cascade plate(s) 426 and anode 419 by insulated bolt 427 or by equivalent fasteners. Cascade plate 426 is electrically insulated from cathode support plate 428 and anode 419 by spacers 415 comprising an electrically insulating material that can withstand elevated temperatures. For example, spacers 415 may comprise O-ring vacuum seals, polyvinyl chloride rings, boron nitride rings or the like.

Plasma discharge at high power density and high temperature tends to heat cascade plate(s) 426 and anode 419. Preferably, therefore, cascade plate(s) 426 and anode 419 contain coolant channels 429 and 440, respectively. The channels 429, 440 typically have a circular shape within the bulk of plate(s) 426 and anode 419. Coolant, such as chilled water supplied through a water supply line 406, flows through channel 440 to cool the anode 419 during operation. A similar water supply line (not shown) is provided to supply water to channel 429.

Nozzle 418 is preferably attached to or mounted on anode 419. Alternatively, nozzle 418 can be formed onto anode 419 as one contiguous unit.

Nozzle 418 can optionally further include an integral or removable divergent portion, referred to as a nozzle extension 439, for confinement and further directing of the plasma and reactive species flow.

Reagent supply lines 412, 414 and 416 are in fluid communication with nozzle 418. Nozzle 418 typically includes one or more injectors coupled to reagent supply line(s) 412, 414, and 416 providing for the delivery of reagents into the plasma. The injectors may include ring shaped reagent supply channels connected to injection holes or a slit-shaped injector. For example, as shown in FIG. 4, reagent supply line 414 connects to reagent supply channel 435 formed inside the body of nozzle 418. Reagent supply channel 435 contains a plurality of openings 434, which are preferably evenly distributed around the circumference of channel 435. The reagent flows in several directions from line 414 into channel 435 and then simultaneously through openings 434 into the nozzle. Likewise, supply line 416 is connected to channel 433 and openings 432 and supply line 412 is connected to channel 431 and openings 430.

The reagents are supplied to the plasma through supply lines 412, 414, 416, but it will be understood that more or fewer supply lines and associated structure elements may be present, depending on the chemistry of the desired plasma. For example, oxygen gas may be supplied through line 414, zinc may be supplied through line 416, and indium may be supplied through line 412 to form an indium zinc oxide film on substrate 12. Line 416 may be sealed and oxygen and zinc supplied if a zinc oxide film is to be deposited. Illustrative reagents include oxygen, nitrous oxide, nitrogen, ammonia, carbon dioxide, fluorine, sulfur, hydrogen sulfide, silane, organosilanes, organosiloxanes, organosilazanes and hydrocarbons for making oxide, nitride, fluoride, carbide, sulfide and polymeric coatings. Examples of other metals whose oxides, fluorides, and nitrides may be deposited in the same way are aluminum, tin, titanium, tantalum, niobium and cerium. Alternatively, oxygen and hexamethyldisiloxane, tetramethyldisiloxane or octamethylcyclotetrasiloxane may be supplied to form a silica-based hardcoat. Other types of coatings which can be deposited by ETP will be apparent to those skilled in the art.

It has been discovered that, for each ETP generating means, the coating deposition characteristics vary spatially according to a bell curve, with the maximum of the curve corresponding to the central axis of the ETP generating means. Examples of such characteristics are substrate temperature rise due to plasma exposure and the thickness of the coating produced. A temperature profile is produced because the center portion of a plasma plume has a higher plasma density and thermal load than the edge portions thereof. As an illustration of this variation in deposition properties, a polycarbonate substrate may typically vary in temperature by about 10–30° C. from the central axis to the edge portion of a single plasma plume.

One embodiment of the invention, therefore, includes at least one and preferably a plurality of temperature control means located and adapted to heat regions of the substrate spaced from the central axes of the ETP generating means. When heating means are employed, they may be of any type; examples are infrared heaters (i.e., heat lamps), microwave heaters, resistance heaters and non-reactive plasma streams. The power supplied to the heating means is preferably effective to maintain a substantially uniform substrate temperature, the term "substantially uniform" meaning a temperature difference over the substrate area of about 10° C. or less, preferably about 6° C. or less.

The heating means are preferably located within the deposition chamber, for example, between the ETP generating means and normally at the halfway point, to provide simultaneous deposition and heating. It is often preferred, however, to locate the heating means upstream (with respect to substrate movement) from the ETP generating means, or even in a separate preheating chamber. When so located, they will ordinarily be centered on a line extending parallel to the downstream motion of the substrate to a point halfway between the ETP generating means.

Figure 5:
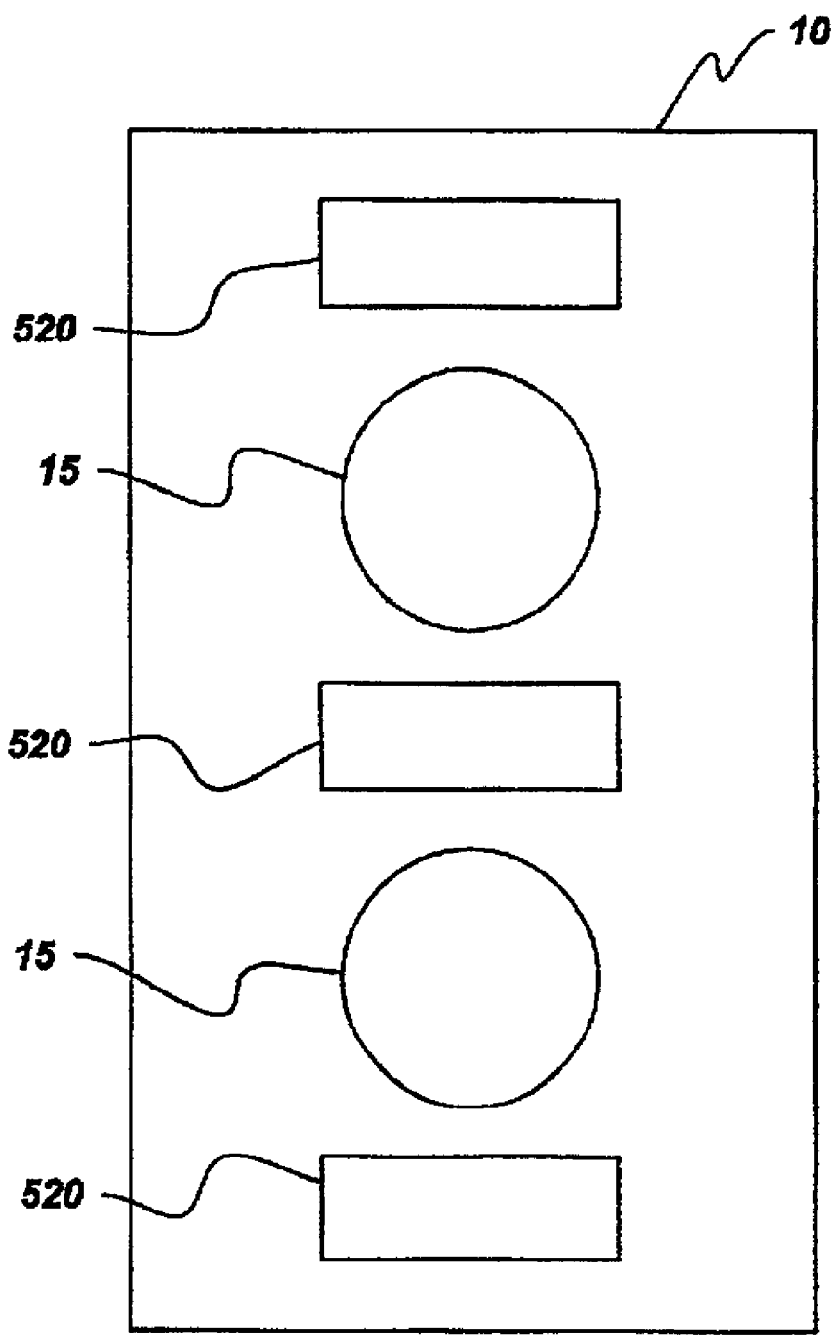
FIGS. 5 and 6 are views of embodiments of the invention in which heating elements are respectively located between and upstream of the ETP generating means.
Figure 6:
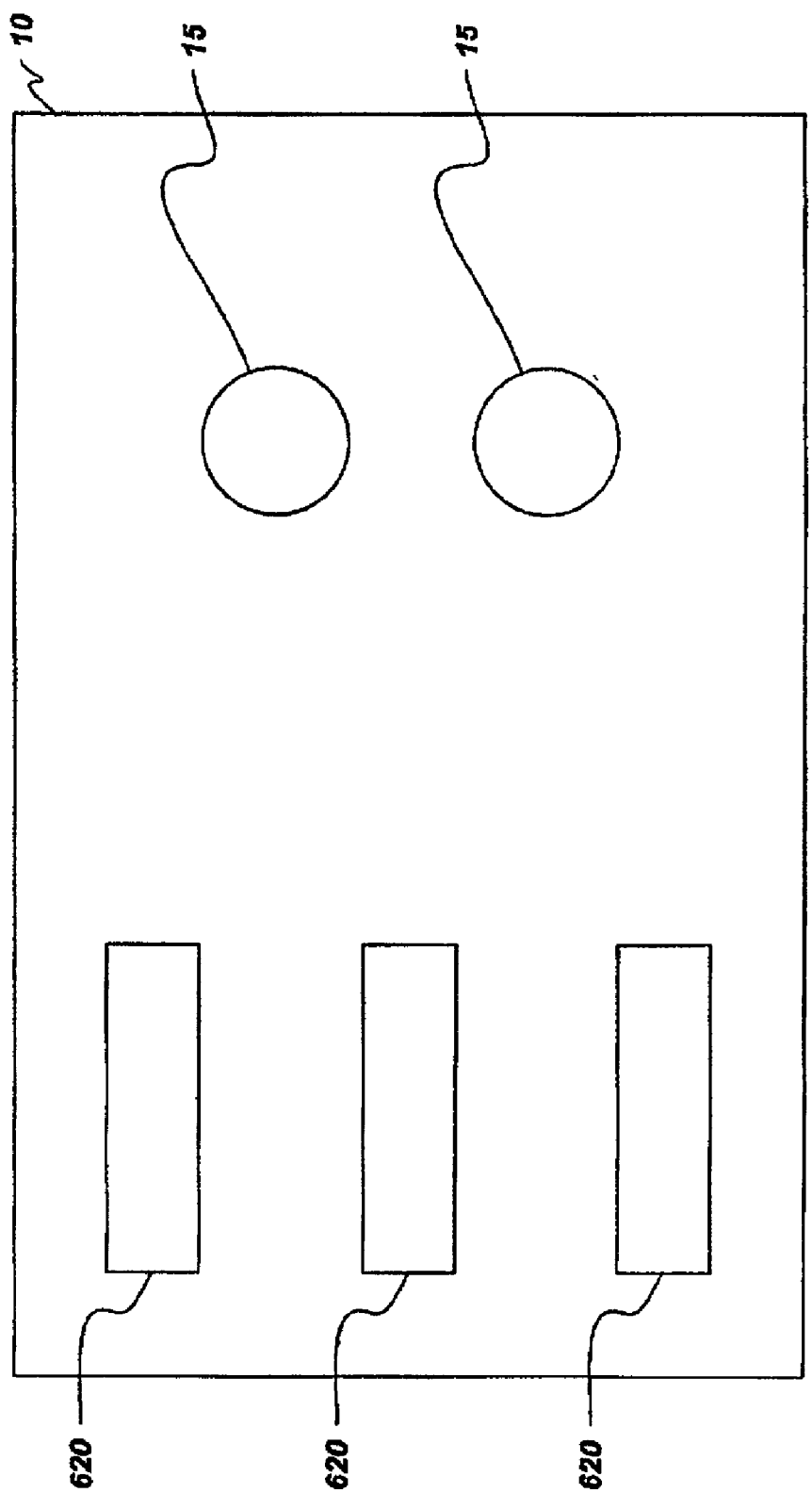

Illustrative configurations of apparatus of the invention including heating means are depicted in FIGS. 5 and 6. In FIG. 5, two ETP generating means 15 and three heating elements 520 are located in deposition chamber 10. The heating elements are located on either side of and between the ETP generating means, so as to provide simultaneous deposition and heating with the heated regions being on either side of the central axes of the plasma plumes. FIG. 6 shows a different arrangement in which three heating elements 620 are located upstream from two ETP generating means 15 (substrate movement being from left to right in a plane parallel to that of the figure) but within deposition chamber 10.

Spacing of the ETP generating means also has an effect on the uniformity of the coating deposited on the substrate. In order to maximize uniformity, it is preferred to provide a spacing such that there is overlap between the edge portions of the plurality of plasma plumes. The precise amount of overlap will depend on numerous factors, such as the size of the plasma produced by the ETP generating means, the distance of the ETP generating means from the substrate, power to the ETP generating means, and flow rates of various reagents. It is a relatively simple matter to determine by simple experimentation the optimum spacings for each coating apparatus. It is often found, for example, that excellent results are obtained when the anode (as shown in FIG. 4) of each ETP generating means is about 20–40 cm and especially about 25–28 cm from the substrate at a chamber pressure of about 30 to about 60 millitorr. The spacing (D in FIG. 1) between center axes of the ETP generating means is generally about 10–21 cm and especially about 12–18 cm for wall-stabilized DC arc plasma generators operated at a pressure of about 200–800 torr.

Figure 7:
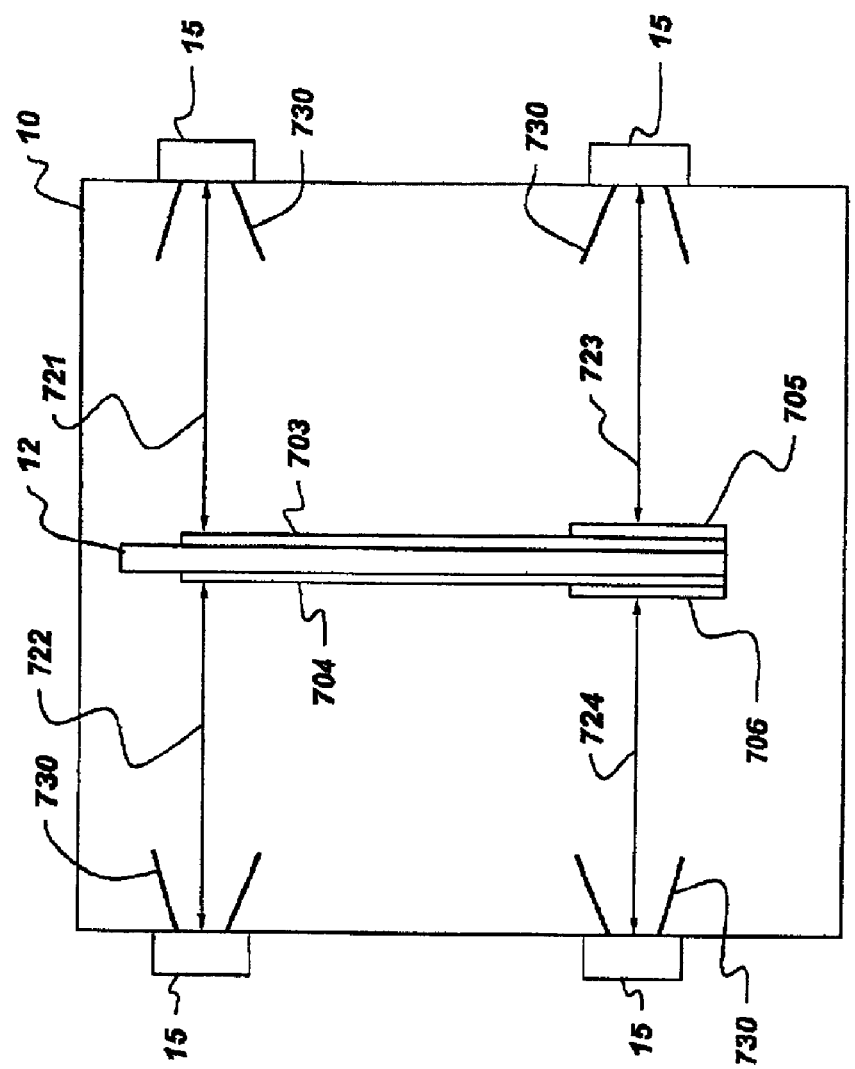
FIG. 7 is a view of an embodiment in which the substrate is coated simultaneously on both sides.

The apparatus depicted in FIG. 1 is adapted to coat only one side of a substrate a single time. The invention includes, however, coating more than one side at once, as well as depositing successive coatings. An illustrative apparatus for this purpose is shown in FIG. 7. It includes deposition chamber 10, substrate 12 and eight ETP generating means 15 of which only the four top ones are visible, the other four being immediately below the ones shown. Each ETP generating means shown in FIG. 7 includes nozzle 730, the word "nozzle" as used in this context including any nozzle extension (439 in FIG. 4). Substrate 12 moves in the direction of the arrow whereupon plasma plumes 721, 722 form coatings 703 and 704 on opposite sides of substrate 12, and plasma streams 723, 724 form superimposed coatings 705 and 706.

While the substrate in FIG. 1 is shown as planar, the apparatus depicted in that figure may also be employed to coat an object having a curved surface, provided said surface is nearly planar; i.e., its curvature is slight or only parts thereof are curved. However, a modification of the apparatus, which may advantageously be employed to coat articles with a higher curvature, is shown in FIG. 8.

Curved substrate 812 in FIG. 8 again moves in a plane perpendicular to that of the figure, and enters and exits deposition chamber 10 through openings 23. Eight PECVD means 15 produce plasma plumes which form coatings 3 and 4 on opposite sides of substrate 812. Nozzles 830 are of varying lengths so that they produce a distance of constant length between the end of the nozzle and curved substrate 812. Further, nozzles 830 may have successive portions of unequal length with, for example, the upper portions of the nozzles at the top of the figure being shorter than the lower portions.

Figure 8:
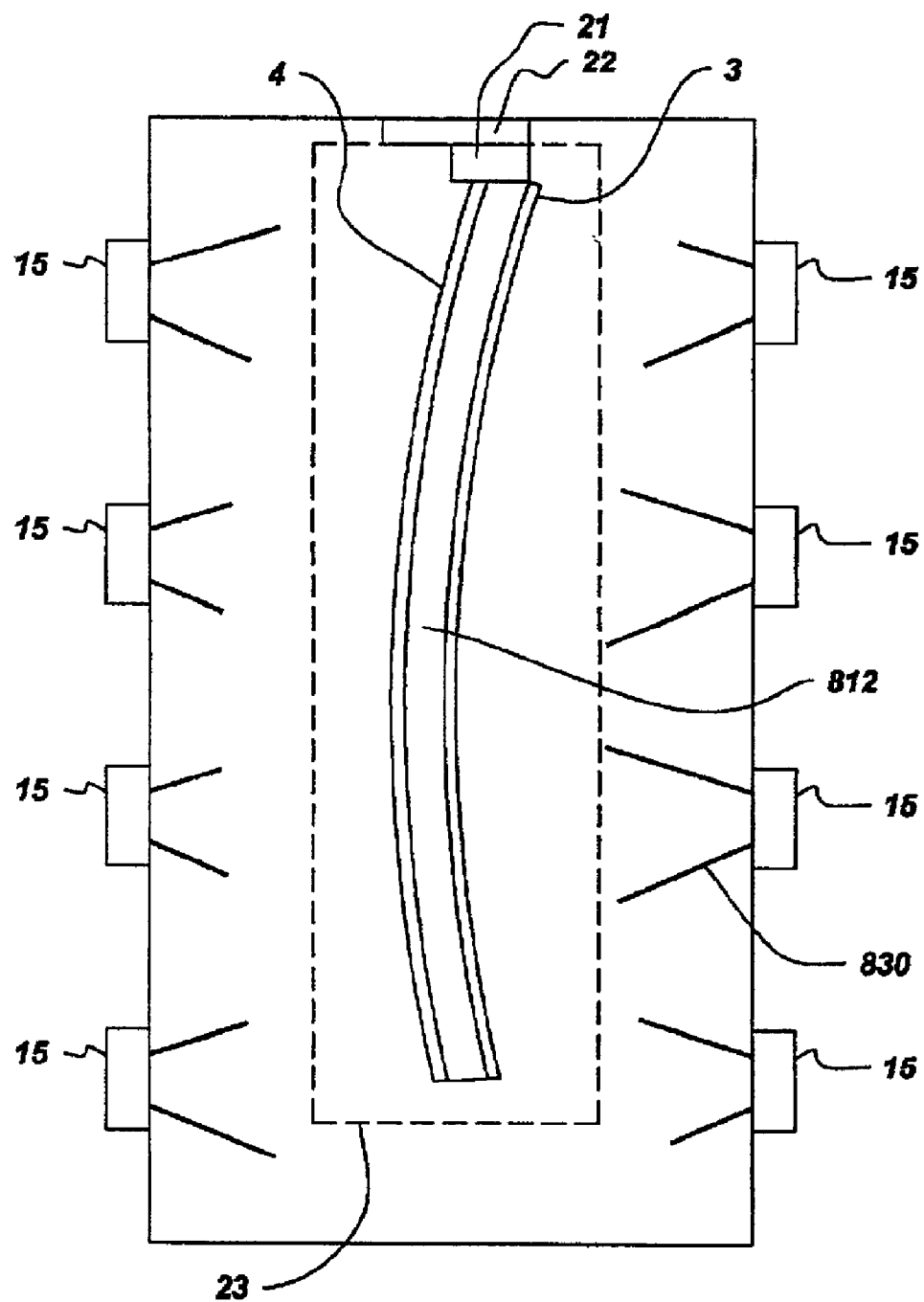
FIG. 8 is a view of an embodiment adapted to coat a curved substrate.

The configuration shown in FIG. 8 includes placement of the anodes of the ETP generating means at a constant distance from the curved substrate. Alternatively, ETP generating means which include nozzles with variation in plasma generation conditions may be used, producing equivalent effects on the various portions of the substrate at different distances from the anodes.

It is also contemplated to provide for motion of the plasma plumes impinging on the substrate, so as to scan a region of the substrate, This may be achieved by mounting the ETP generating means or the nozzles associated therewith on swivels that may be manually or computer controlled. It may also be achieved by mounting one or more magnets on or near the walls of the deposition chamber, thereby permitting magnetic variation of the direction and shape of the plasma plume.

One preferred embodiment of the invention includes the use of a plurality of deposition chambers and sets of ETP generating means for deposition of plural coating layers on a substrate. FIGS. 9 and 10 are orthogonal cross-sectional views of an illustrative apparatus for such deposition. Of course, such an apparatus will most often employ a single substrate support means and movement actuator adapted to convey said substrate through said deposition chambers in succession.

In FIGS. 9–10, there are shown three deposition chambers 901, 902 and 903. Each of said chambers is shown as containing eight ETP generating means 15, four on each side of the substrate (although the number thereof is not critical), with each of said ETP generating means having a nozzle, one of said nozzles being designated 916. Each pair of deposition chambers is connected by a pump port 924, and the input and output ends of the system are attached to load locks, 925 and 926. These items provide for removal of gases, to maintain subatmospheric pressure in the chamber, and for sample loading and unloading. Substrates 12, two in number as shown, move through the system from left to right as shown by the arrows, receiving three successive coatings in the three deposition chambers.

It will be apparent that the multiple chamber apparatus illustrated in FIGS. 9–10 can be modified in various ways. For example, one or more ETP generating deposition chambers may be replaced by chambers designed for deposition of coatings by sputtering, evaporation, chemical or physical vapor deposition or the like, or by non-coating plasma treatment chambers. Also, pump ports 924 and load locks 925 and 926 may be replaced or supplemented by conventional heating, pretreatment, or post-treatment units.

Figure 11:
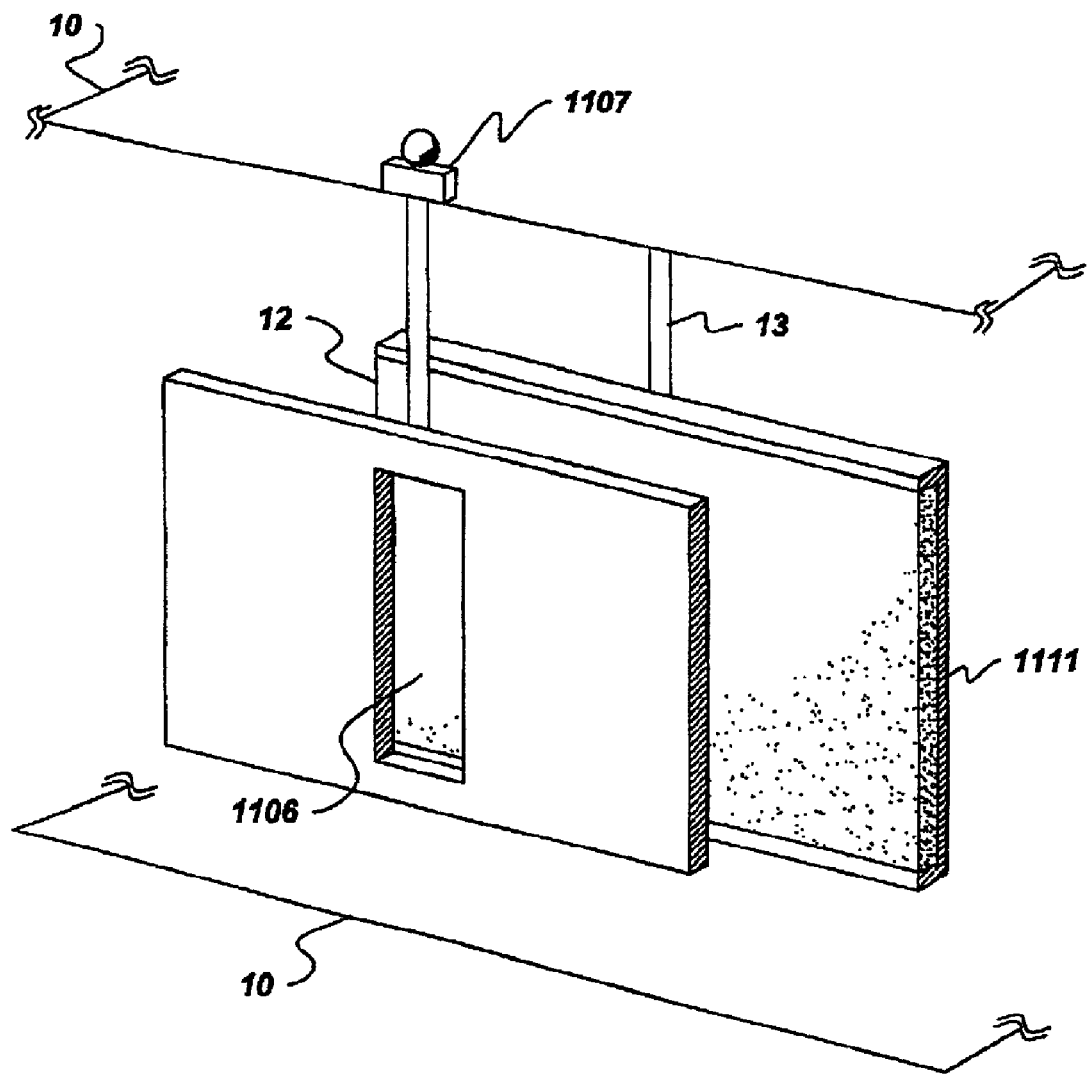
FIG. 11 is a cross-sectional view of an embodiment including a shutter between the ETP generating means and the substrate, as well as an alternative substrate support means.

A further feature of the invention which may preferably be employed under certain conditions is shown in FIG. 11. It is a shutter 1105 situated in deposition chamber 10 between substrate 12 and the ETP generating means (not shown), said shutter being positioned by handle or positioning means 1107. Said shutter contains one or more apertures 1106 configured so as to allow overlapping of adjacent plasma plumes but block the relatively low power edge portions of said plumes. Also shown in FIG. 11, is substrate support means 1111 comprising a flat panel which provides support for the entire substrate, which is attached to movement actuator 13 and which may be used if only one side of the substrate is to be coated.

The invention is illustrated by the following examples.

EXAMPLE 1

A flat substrate, 30×30 cm, of a commercially available bisphenol A polycarbonate, coated with a chemically deposited silicone hardcoat, was vertically mounted in a deposition chamber of a coating apparatus containing two ETP generating means. The working distance between the anodes of the ETP generating means and the substrate was 36 cm, the center-to-center spacing between the ETP generating means was 19 cm, and the effective scanning width of the deposition was about 30 cm.

The deposition chamber was evacuated to a pressure of less than 5 millitorr, and an argon plasma plume was generated by flowing argon through the arcs in the ETP generating means and applying a direct current between the cathodes and anodes thereof while maintaining deposition chamber pressure at about 35 millitorr. Oxygen was injected into the argon plasma and the substrate was exposed to the argon-plasma plume in a plasma pretreatment step. The substrate was scanned three times in a vertical direction past the ETP generating means.

A tetramethyidisiloxane (TMDSO) precursor vapor was then supplied to the argon-oxygen plasma plume to deposit a silica-based coating 3 on the substrate. An argon-oxygen plasma post-treatment step was carried out after the deposition step.

The thickness of the coating was measured at five points at the center and the corners of each of seven 10×10-cm sections of the substrate, using a Dektak profilometer. Also measured, at midpoints of the sides of each section, was the Taber haze increase, which is a measure of abrasion resistance of the sample; it was measured by determining the initial haze of the coated sample using a Gardner haze meter, rolling a pair of CS-10F wheels with 500-g load each 1000 times in a circle over the sample and measuring the haze (in percent) after the wheel rolling step. Coating thickness was 2.6 micron in average with a standard deviation of 0.2 micron. The average Taber haze increase was 2.8% with a standard deviation of 0.4. Control panel sections which had not been coated showed a Taber haze increase in the range of about 12–16%. Thus, the abrasion resistance of the coating produced by the method of the invention was demonstrated.

EXAMPLE 2

The procedure of Example 1 was repeated, except that a curved substrate, adapted for use as an automobile window, was employed. The increase in Taber haze was measured at the centers of each side of five 10×10-cm sections of the substrate. The average increase was 2.7% with a standard deviation of 0.4%. Thus, the method of the invention was shown to be effective on curved as well as flat substrates.

EXAMPLE 3

The procedure of Example 1 was repeated, except that an array of three ETP generating means, arranged in a zigzag configuration, was employed. The ETP generating means were arranged so that the vertical distance between the centers of the plasma plumes was 15 cm and the horizontal distance was about 26 cm. A retractable shutter having an aperture 20 cm wide was placed between the ETP generating means and the substrate.

Coating thicknesses and Taber haze increases were measured as in Example 1 Thicknesses were 4.1 micron in average with a standard deviation of 0.4 micron. The average Taber haze increase was 1.9% with a standard deviation of 0.3%.

EXAMPLE 4

The procedure of Example 3 was repeated, with the exception that a curved substrate, adapted for use as an automobile window, was employed. The average Taber haze increase was 2.3% with a standard deviation of 0.5%.

EXAMPLES 5–8

Figure 12A:
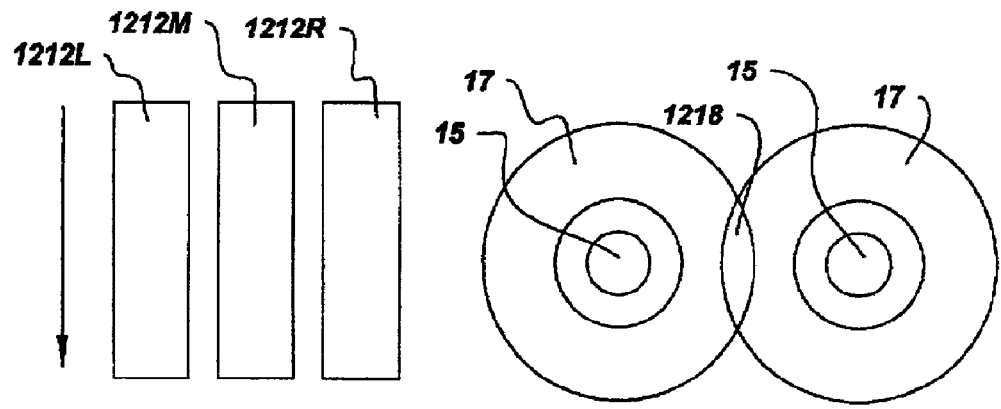
FIGS. 12A and 12B are orthogonal views illustrating the configuration of Examples 5–8.
Figure 12B:
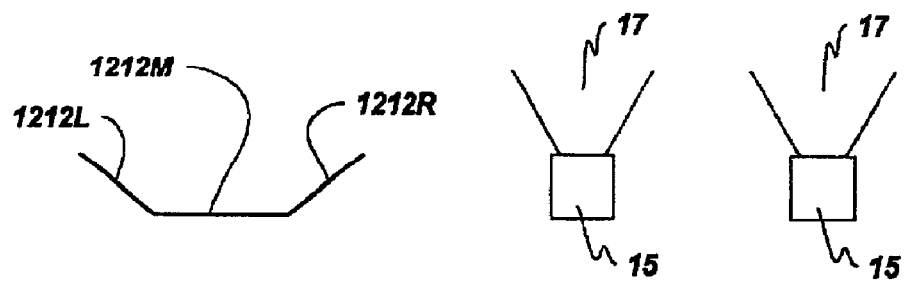

These examples illustrate the effects of operating variables on coating properties and performance. The experimental setup is illustrated in FIGS. 12A and 12B. Three 10×30-cm flat bisphenol A polycarbonate subpanels 1212L, 1212M, 1212R respectively were mounted as substrates on a threefold substrate panel with an incline angle of 10° between adjacent subpanels, said panel being generally in the plane of the paper. Two wall-stabilized DC arcs 15, located in a plane beneath that of the paper, were used as the ETP generating means for the deposition of a coating on one side of substrates 1212 using an argon-oxygen-octamethylcyclotetrasiloxane ("D4") plasma, and moving the substrates from top to bottom as indicated by the arrow in FIG. 12A. Subpanels 1212L and 1212R were mainly exposed to the center portions of two plasma plumes 17, while subpanel 1212M was mainly exposed to the overlap portion 1218 of the plumes. After being coated, the substrates were cut into 10×10-cm coupons for Taber and thickness measurements. Deposition conditions and coating performance are given in Table 1.

TABLE I

| Example | 5 | 6 | 7 | 8 |
|---|---|---|---|---|
| Spacing between arcs, cm | 21 | 21 | 17 | 17 |
| Distance, anode to substrate, cm | 35 | 26 | 26 | 26 |
| Current, amp | 75 | 50 | 75 | 75 |
| Chamber pressure, mtorr | 30 | 60 | 30 | 30 |
| Argon feed rate, slm | 2.4 | 1.4 | 2.4 | 1.4 |
| Oxygen feed rate, slm | 1.2 | 1.2 | 1.2 | 1.2 |
| D4 vapor feed rate, slm | 0.2 | 0.4 | 0.4 | 0.2 |
| Scan rate, cm/sec | 1.4 | 0.3 | 3.3 | 0.8 |
| Coating thickness, microns: | | | | |
| L | 1.7 | 5.5 | 1.3 | 3.1 |
| M | 2.0 | 2.4 | 2.0 | 3.5 |
| R | 1.7 | 5.9 | 1.3 | 3.1 |
| Taber haze increase, %: | | | | |
| L | 17 | 2.0 | 12 | 1.7 |
| M | 2.7 | 15 | 10 | 2.0 |
| R | 21 | 1.1 | 12 | 2.2 |

It is apparent that coatings can have non-uniform performance over the area. Taber haze increase can be high on sub-panels L and R, but low on M (Example 5); or the opposite (Example 6). Coatings can have uniform but poor Taber performance (Example 7), or uniformly good Taber performance (Example 8). Operating variables given in Table 1 have been found to be very important with respect to achieving coating performance using the ETP deposition method of the invention. Variables such as reagent and gas feed rates are associated with CVD processes only, and would be totally irrelevant to a PVD process such as the anodic arc.

EXAMPLES 9–12

A two-source linear array was used to deposit a coating similar to that of Example 1 on flat bisphenol A polycarbonate substrates. The substrates were supported on either a flat or, to simulate curved surfaces, a curved substrate holder. Three 10.2×30.5-cm substrates, forming a 30.5×30.5-cm total area, were coated. A vacuum chamber with an internal substrate scanning mechanism was used. The coating procedure typically included the steps of loading the substrate into the deposition chamber, pumping down the deposition chamber to vacuum, preheating the substrate to the desired temperature profile, using an ETP source to generate a plasma plume containing the deposition reagents, scanning the substrates to deposit coatings thereon, extinguishing the ETP source, venting the deposition chamber and unloading the substrate.

The substrates were preheated with infrared heaters, which were located as illustrated in FIG. 6. They were then coated with two silica-based hardcoats at a distance of 25.5 cm from the anodes of the ETP generating means. The Taber haze increase was measured at four points on each of three 10.2×10.2 sections of each substrate.

TABLE II lists the preheating conditions. Temperatures are in degrees C. The term "Preheat/center" indicates a preheating temperature in a substrate region to be irradiated by the center portions of the plasma streams. The term "Preheat/overlap" indicates a preheating temperature in a substrate region to be irradiated by an overlap of the edge portions of the plasma streams. The term "Deposition temp./center" indicates the deposition temperature of substrate regions irradiated by the center portions of plasma streams. The term "Deposition temp/overlap" indicates the deposition temperature of the substrate region irradiated by the overlap of the edge portions of plasma streams. Thus, the terms "Deposition temp." denote the temperatures resulting from the heat retained from the preheating step and the heating of the substrate by the plasma streams. The terms "Taber/center" and "Taber/overlap" refer to the Taber haze increase, in percent, in the regions of the substrate irradiated by the center and the overlap of the plasma streams, respectively. The preheating temperature was measured by thermocouples placed in the array.

TABLE II

| Example | Preheat/ center | Preheat/ overlap | Deposition temp./center | Deposition temp./overlap | Taber/ center | Taber/ overlap |
|---|---|---|---|---|---|---|
| 9 | 85 | 85 | 133 | 103 | 3 | 10 |
| 10 | 100 | 100 | 146 | 116 | 2.5 | 5 |
| 11 | 85 | 110 | 149 | 147 | 3 | 3 |
| 12 | 114 | 130 | 160 | 155 | 2 | 2 |

It will be apparent that the uniform center-overlap preheating conditions of Examples 9 and 10 resulted in substantial variation in deposition temperature (about 30° C.) and did not afford satisfactory Taber values. In Example 5, for instance, the difference in Taber varied from 3 to 10. In contrast, the differential heating conditions of Examples 11 and 12, in which preheat temperature variations of 15° and 16° C. resulted in relatively constant deposition temperatures varying only in the range of 2–5° C., afforded very uniform Taber values.

Those skilled in the art will understand that the most favorable preheating and deposition conditions will vary with the substrate being coated and the coating conditions. For any given set of conditions, they can be determined by simple experimentation.

While typical embodiments have been set forth for the purpose of illustration, the foregoing descriptions and examples should not be deemed to be a limitation on the scope of the invention. Accordingly, various modifications, adaptations, and alternatives may occur to one skilled in the art without departing from the spirit and scope of the present invention.

What is claimed is:

1. A method for coating a substrate which comprises generating a set of at least two expanding thermal plasma plumes to produce plasma enhanced chemical vapor deposition or PECVD of a coating on said substrate, each of said plumes in said set having a central axis, wherein said central axes of said plasma plumes are oriented parallel to each other and are perpendicular to a translation direction of the substrate: and heating at least one portion of the substrate by a heating means other than the at least two expanding thermal plasma plumes, said heating means being located and adapted to heat regions spaced from the central axes of said plasma plumes.

2. The method according to claim 1, wherein the substrate is a thermoplastic substrate.

3. The method according to claim 2, wherein the thermoplastic is a polycarbonate.

4. The method according to claim 1, wherein the plasma is an argon or argon-organosiloxane plasma.

5. The method according to claim 4, wherein the coating is silica-based.

6. The method according to claim 1, wherein substrate regions spaced from the center axes of expanding thermal plasma generating means producing said coating are heated prior to or simultaneously with the coating operation.

7. The method according to claim 1, wherein a plurality of sets of plasma plumes is generated to deposit coatings on more than one side of said substrate.

8. The method according to claim 1, wherein a plurality of sets of plasma plumes is generated to deposit successive coatings on said substrate.

9. The method according to claim 1, wherein the substrate is planar.

10. The method according to claim 1, wherein the substrate is curved.

11. A method for coating a polycarbonate substrate the method comprising generating a plurality of sets of at least two expanding thermal plasma plumes, to produce successive coating: on said polycarbonate substrate while moving said substrate past said sets of plumes, each of said plumes in said set being codirectionally oriented and perpendicular to a translation direction of the polycarbonate substrate; said coatings being silica-based and the plasmas being argon or argon-oxygen plasmas; and heating at least one portion of the polycarbonate substrate by a heating means other than the at least two expanding thermal plasma plumes, said heating means being located and adapted to heat regions spaced from the central axes of said plasma plumes.

12. A method of producing a plasma enhanced chemical vapor deposition coating on a substrate, the method comprising the steps of:

a) providing the substrate to the deposition chamber;

b) providing at least one set of expanding thermal plasma means, wherein the at least one set of expanding thermal plasma means comprises at least two expanding thermal plasma generating means that are codirectionally oriented and located outside and in fluid communication with a deposition chamber and wherein each of the plasma means are perpendicular to a translation direction of the substrate;

c) maintaining the at least one set of expanding thermal plasma means at a pressure that is greater than a pressure in the deposition chamber;

d) generating a plurality of plasmas within the at least one set of expanding thermal plasma means;

e) expanding the plurality of plasmas into the deposition chamber to form a plurality of expanding thermal plasma plumes directed toward the substrate, wherein each of the plurality of expanding thermal plasma plumes has a central axis, wherein the central axes of the plurality of expanding thermal plasma plumes are oriented parallel to each other; and f) providing at least one reagent to the plurality of expanding thermal plasma plumes, wherein the at least one reagent interacts with the plurality of expanding thermal plasma plumes to form the plasma enhanced chemical vapor deposition coating on a substrate; and g) heating at least one portion of the substrate by a heating means other than the plurality of expanding thermal plasma plumes, said heating means being located and adapted to heat regions spaced from the central axes of said plasma plumes.

13. The method according to claim 12, wherein the at least one portion of the substrate is located at a predetermined distance from the central axes.

14. The method according to claim 12, wherein the step of heating at least one portion of the substrate comprises heating the substrate to a substantially uniform temperature.

* * * * *